(12) United States Patent
Matsuoka

(10) Patent No.: US 7,427,902 B2
(45) Date of Patent: Sep. 23, 2008

(54) HIGH-STABILITY PIEZOELECTRIC OSCILLATOR

(75) Inventor: Jun Matsuoka, Chigasaki (JP)

(73) Assignee: Epson Toyocom Corporation, Tokyo (JP)

( * ) Notice: Subject to any disclaimer, the term of this patent is extended or adjusted under 35 U.S.C. 154(b) by 98 days.

(21) Appl. No.: 11/399,488

(22) Filed: Apr. 7, 2006

(65) Prior Publication Data

US 2006/0237426 A1   Oct. 26, 2006

(30) Foreign Application Priority Data

Apr. 11, 2005   (JP)   ............... 2005-113981

(51) Int. Cl.
*H03B 1/00*   (2006.01)
(52) U.S. Cl. ............... 331/69; 331/68; 331/158
(58) Field of Classification Search ............ 331/65, 331/66, 68, 69, 70, 116 R, 158, 175, 176
See application file for complete search history.

(56) References Cited

U.S. PATENT DOCUMENTS

| | | | |
|---|---|---|---|
| 3,287,658 A | | 11/1966 | Sulzer et al. |
| 3,619,806 A | * | 11/1971 | Phillips ............... 331/69 |
| 6,133,674 A | * | 10/2000 | Fry ............... 310/343 |
| 6,621,361 B1 | * | 9/2003 | Fry ............... 331/69 |
| 6,859,110 B2 | * | 2/2005 | Satoh ............... 331/69 |
| 2003/0197568 A1 | | 10/2003 | Satoh | |

FOREIGN PATENT DOCUMENTS

| | | |
|---|---|---|
| JP | U 60-142536 | 9/1985 |
| JP | A 62-003527 | 1/1987 |
| JP | A 2003-309432 | 10/2003 |

OTHER PUBLICATIONS

S.V. Anastasiev. et al; A New High Stability DOCXO. Statistics of the Results of Frequency Stability Measurements.; Proceedings of the 2002 IEEE International Frequency Control Symposium & PDA Exhibition.; May 2002; pp. 633-638.

John Ho . et al; A Fast Warmup Oscillator for the GPS Receiver; 31st Annual Frequency Control Symposium Electronic Industries Assoc Washington, D.C.; 1977 pp. 421-428.

* cited by examiner

*Primary Examiner*—Robert J. Pascal
*Assistant Examiner*—Ryan J. Johnson
(74) *Attorney, Agent, or Firm*—Oliff & Berridge, PLC

(57) ABSTRACT

There is provided a high-stability piezoelectric oscillator. The high-stability piezoelectric oscillator includes an oscillating circuit unit that has a piezoelectric vibrator and oscillating circuit components, an inner oven that accommodates the oscillating circuit unit, an outer oven that accommodates the inner oven, and an outer metallic case that covers the outer oven. Further, airtightness is ensured inside and outside the outer metallic case. Furthermore, at least one of the outer oven and the inner oven is airtightly sealed.

3 Claims, 6 Drawing Sheets

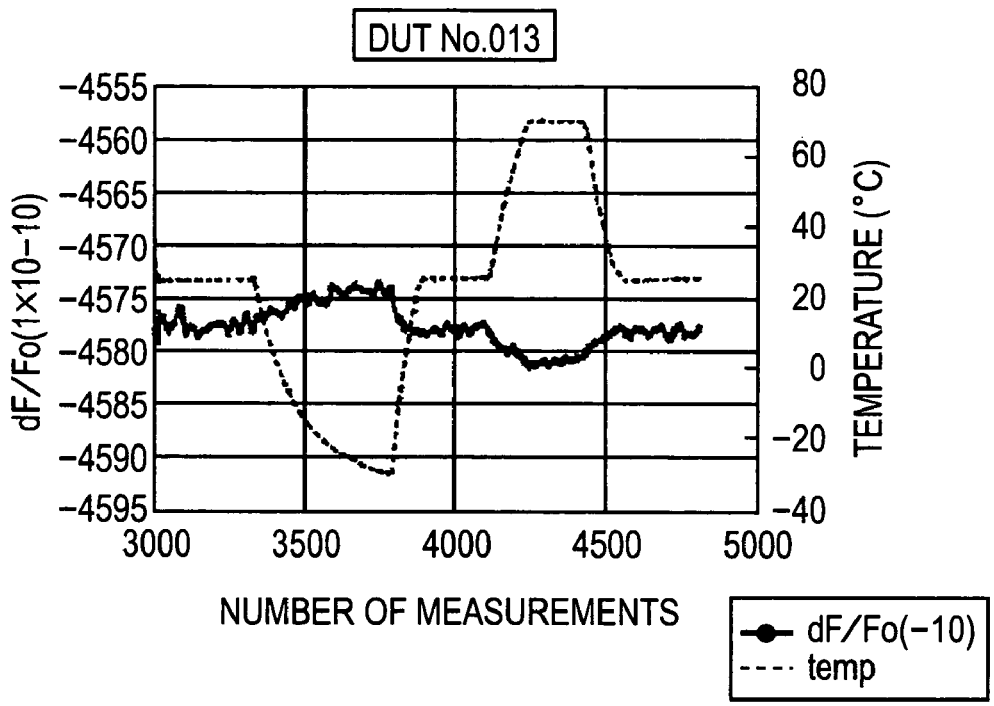
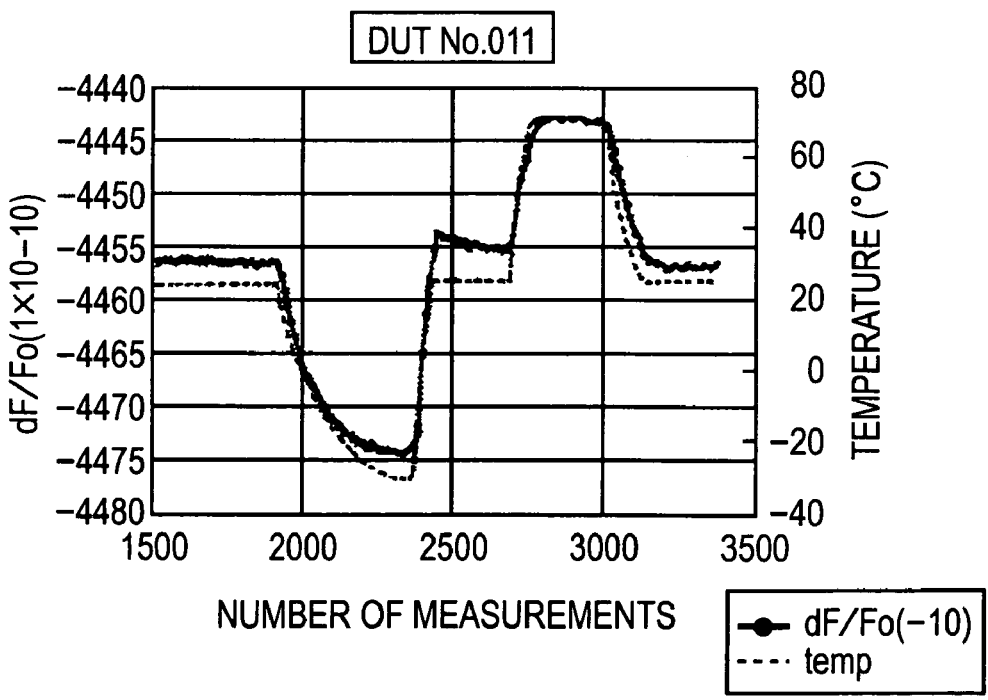

HIGH-STABILITY PIEZOELECTRIC OSCILLATOR

BACKGROUND

1. Technical Field

The present invention relates to a high-stability piezoelectric oscillator which includes a double thermostatic oven.

2. Related Art

Generally, for various piezoelectric oscillators which have been used as a reference signal source for a GPS frequency generating device, a base station for a portal terminal, or the like, piezoelectric oscillators (crystal oscillators), each of which has excellent resonance characteristic and uses a crystal having high frequency stability, have been used. In recent years, a crystal oscillator, which has been used for the various devices or base stations, is required to have a stable oscillating output even under poor environmental conditions where the ambient temperature varies or the temperature and humidity is high. Therefore, as an oscillator which can satisfy this request, an oven controlled crystal oscillator (hereinafter, referred to as 'OCXO') has been mainly used.

FIG. 7 shows an OCXO according to the related art. This OCXO includes upper and lower printed circuit boards 101 and 102 (circuit mounted boards), a crystal resonator 103 whose a lead terminal 103a is connected to the upper printed circuit board 101 and which is accommodated in a thermostatic oven 104, a thermo-sensitive element 105 that is installed in the thermostatic oven 104, temperature control circuit components 106 that are mounted on the lower printed circuit board 102, oscillating circuit components 107 that are mounted on the upper printed circuit board 101, pins 108 that pass through the upper and lower printed circuit boards 101 and 102 so as to electromechanically connect the upper and lower printed circuit boards 101 and 102 to each other, and an outer casing 110 that surrounds the upper and lower printed circuit boards 101 and 102, the crystal resonator 103, the thermo-sensitive element 105, the temperature control circuit components 106, the oscillating circuit components 107, and the pins 108. The outer casing 110 has a lower case 111 that forms a bottom plate, and an upper case 112 that surrounds a space formed on the lower case 111, including the above-mentioned various constituent elements. A lower end portion of each of the pins 108 passes through the lower case 111 to protrude downward. As a result, each of the pins 108 serves as a connection unit when the oscillator is mounted on a mother board (not shown).

The thermostatic oven 104 is controlled by means of the thermo-sensitive element 105 and the temperature control circuit 106 such that a predetermined temperature can be maintained in the thermostatic oven even if the ambient temperature varies, and thus a predetermined temperature is maintained in the crystal resonator 103 in the thermostatic oven 104. The upper and lower printed circuit boards 101 and 102, to which the thermostatic oven 104 is attached, are electromechanically connected to each other by means of the connection pins 108 so as to be firmly fixed. In this state, the upper and lower printed circuit boards 101 and 102 are supported on the lower case 111 by means of the pins 108. The lower case 111 is covered with the upper case 112, so that a shielding effect or an effect of preventing the heat from radiating from the thermostatic oven can be achieved. For the frequency stability (frequency-temperature characteristic) of the OCXO having the above-mentioned structure with respect to the variation of the ambient temperature, frequency stability of about $10^{-8}$ can be obtained.

As oscillators for obtaining oscillating output having higher stability than the OCXO, for example, in JP-UM-A-60-142536, an oscillator having the following structure has been disclosed. According to this oscillator, a crystal resonator and an oscillating circuit are accommodated in a heat-insulated case composed of a thermos bottle, and a heat capacity of the thermostatic oven is increased so as to obtain higher temperate stability. Further, in JP-A-62-003527, an oscillator having the following structure has been disclosed. According to this oscillator, higher temperature stability is obtained by using a double thermostatic oven that includes an inner oven and an outer oven. Furthermore, in JP-A-2003-309432, a high-stability piezoelectric oscillator having the following structure has been disclosed. According to this high-stability piezoelectric oscillator, a thermostatic oven, in which a piezoelectric vibrator and oscillating circuit components are accommodated, is disposed in a metallic case.

FIG. 8 is a diagram illustrating a structure of a high-stability piezoelectric oscillator using a double thermostatic oven having an inner oven and an outer oven.

This high-stability piezoelectric oscillator includes an oscillating circuit unit 114 that has a piezoelectric vibrator 112 and oscillating circuit components 113, an inner oven 115 (having an inner lower case member 115a and an inner upper case member 115b) that accommodates the oscillating circuit unit 114, an outer oven 120 (having an outer lower case member 120a and an outer upper case member 120b) that accommodates the inner oven 115, a base printed circuit board 125 that supports the oscillating circuit unit 114, the inner oven 115, and the outer oven 120, and an outer metallic case 130 (having a lower metallic case member 130a and an upper metallic case member 130b) that covers the outer oven 120 and the base printed circuit board 125. The inner printed circuit board 116 is disposed in the inner oven 115 such that it supports the piezoelectric vibrator 112 and the oscillating circuit components 113. In addition, the outer printed circuit board 121 is disposed in the outer oven 120 such that it supports the inner oven 115, the heater 122, and a temperature control circuit component of the heater 122. Further, the base printed circuit board 125 supports a heater 126 and a temperature control circuit component of the heater 126.

In the high-stability piezoelectric oscillator according to the related art, a bonding portion 131 between an outer circumferential portion of the lower metallic case member 130a that forms a portion of the outer metallic case 130 and a skirt portion of the upper metallic case member 130b is not completely sealed. Further, in each of the inner oven 115 and the outer oven 120, a bonding portion between the upper and lower case members is not completely sealed.

For this reason, outside air may easily permeate into a minute gap of the bonding portion 131 of the outer metallic case 130. If the vapor contained in the outside air having permeated in the outer metallic case 130 is absorbed by the base printed circuit board 125 made of glass epoxy or the like, the base printed circuit board causes deformation, such as expansion, warping, or the like. As a result, a load is applied to the temperature control circuit components of the heater 126 that are mounted on the base printed circuit board 125 because of the stress generated by the deformation of the base printed circuit board, a constant thereof may be easily changed. Specifically, wiring patterns formed on the board deform, so that a floating capacitance may vary. Or, a stress is applied to electronic components, such as a capacitor or the like, forming an oscillating circuit, so that an element value may vary.

Further, in the outer oven 120 and the inner oven 115, each bonding portion is not sealed. Therefore, an outside air containing vapor permeates into the respective ovens, causing the inner printed circuit boards 121 and 116 to also be deformed, which results in a load being applied to each of the temperature control circuit components of the heaters mounted on the respective printed circuit boards or the piezoelectric oscillator 112. As a result, variation is generated in a frequency output by the oscillator and thus reliability is lowered. In a high-stability piezoelectric oscillator which requires frequency stability of $10^{-8}$ to $10^{-9}$ order, even a small amount of frequency variation can cause severe damage. In recent years, higher frequency stability of $10^{-10}$ order has been required.

In order to satisfy a request for high frequency stability, a method of airtightly sealing the bonding portion 131 of the outer metallic case 130 through brazing or resin sealing has been generally adopted. As shown in FIG. 8, ideally, it is expected that frequency stability of $10^{-10}$ order can be achieved by forming a thermostatic oven (oven) with a double structure and sealing the bonding portion of the outer metallic case. However, actually, the frequency is not stabilized, and only frequency stability of $10^{-9}$ order is achieved. That is, according to a high-stability piezoelectric oscillator using the double thermostatic oven, it is considered that frequency stability of $10^{-10}$ order can be obtained because the structure is optimal in obtaining oscillation output with high stability. However, when the oscillation output is output with extremely high stability, the high-stability piezoelectric oscillator is affected by permeation of the outside air, variation in assembly at the time of manufacture, characteristic variation of components, or the like, causing possible variation in a frequency-temperature characteristic.

In the above-mentioned high-stability piezoelectric oscillator using the double thermostatic oven, even when the outer metallic case is airtightly sealed so as to prevent the outside air from permeating therein, it is not possible to achieve the ideal frequency stability of $10^{-10}$ order.

The following reasons are given as to why the above-mentioned problems occur. The inventors have discovered a phenomenon that an oscillation frequency varies in response to the temperature variation of the outside air, and a phenomenon that the frequency variation becomes when the bonding portion of the outer metallic case is not airtightly sealed. Therefore, it is assumed on the basis of the discovery that in a case in which the bonding portion of the outer metallic case is sealed, the expansion or contraction of air sealed in the case generated due to the temperature variation of the outside air causes the frequency to be unstable. In addition, in the high-stability piezoelectric oscillator using the double thermostatic oven, sealing the bonding portion of the outer metallic case airtightly causes the ideal frequency stability of $10^{-10}$ order not to be achieved. However, since it is not possible to accept a disadvantage occurring when the bonding portion of the outer metallic case is not airtightly sealed, development of a high-stability piezoelectric oscillator has been demanded in which it is possible to achieve frequency stability of $10^{-10}$ order without being affected by the temperature variation of the outside air while airtightly sealing the bonding portion.

SUMMARY

An advantage of some aspects of the invention is that it provides a high-stability piezoelectric oscillator using a double thermostatic oven, in which frequency stability of $10^{-10}$ order is achieved without being affected by the temperature variation of outside air while airtightly sealing a bonding portion of an outer metallic case.

A high-stability piezoelectric oscillator according to a first aspect of the invention includes: an oscillating circuit unit that has a piezoelectric vibrator and oscillating circuit components; an inner oven that accommodates the oscillating circuit unit; an outer oven that accommodates the inner oven; and an outer metallic case that covers the outer oven, airtightness being ensured inside and outside the outer metallic case. Further, at least one of the outer oven and the inner oven is airtightly sealed.

Preferably, at least one of a bonding portion between an outer lower case member and an outer upper case member, which form the outer oven, and a bonding portion between an inner lower case member and an inner upper case member, which form the inner oven, is airtightly sealed by using an epoxy resin or solder as a sealant.

A high-stability piezoelectric oscillator according to a second aspect of the invention includes: an oscillating circuit unit that has a piezoelectric vibrator and oscillating circuit components; an inner oven that accommodates the oscillating circuit unit; an outer oven that accommodates the inner oven; and an outer metallic case that covers the outer oven. Further, a material having higher heat conductivity than a metallic material for forming the inner oven is used as a metallic material for forming the outer oven.

A high-stability piezoelectric oscillator according to a third aspect of the invention includes: an oscillating circuit unit that has a piezoelectric vibrator and oscillating circuit components; an inner oven that accommodates the oscillating circuit unit; an outer oven that accommodates the inner oven; and an outer metallic case that covers the outer oven. Further, the outer oven is made of a thin metallic material so as to decrease a heat capacity, and the inner oven is made of a thick metallic material in a block shape so as to increase a heat capacity.

BRIEF DESCRIPTION OF THE DRAWINGS

The invention will be described with reference to the accompanying drawings, wherein like numbers reference like elements.

FIGS. 2A and 2B are graphs illustrating a frequency-temperature characteristic before all of peripheral portions of a bonding portion of an outer oven of the high-stability piezoelectric oscillator (crystal oscillator) shown in FIGS. 1A and 1B are sealed with an epoxy resin serving as a sealant.

DESCRIPTION OF EXEMPLARY EMBODIMENTS

Hereinafter, preferred embodiments of the invention will be described in detail with reference to the accompanying drawings.

Figure 1A:
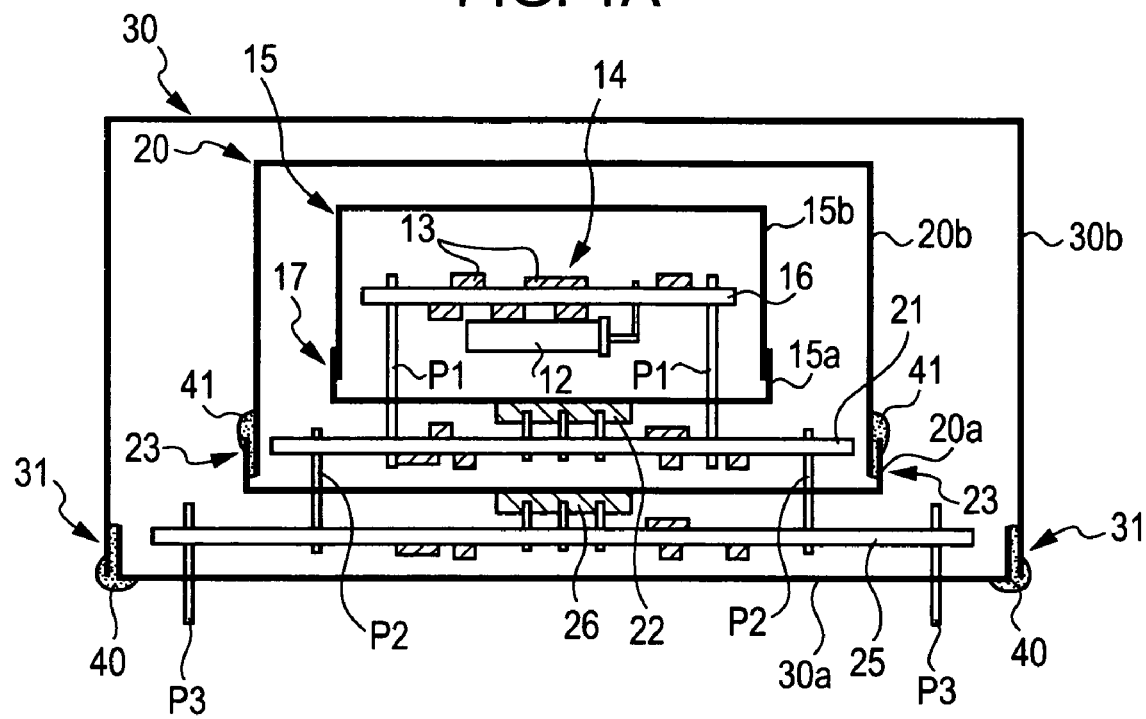
FIGS. 1A and 1B are a longitudinal cross-sectional view illustrating a structure of a high-stability piezoelectric oscillator according to a first embodiment of the invention and a longitudinal cross-sectional view illustrating an outer metallic case of the high-stability piezoelectric oscillator.
Figure 1B:
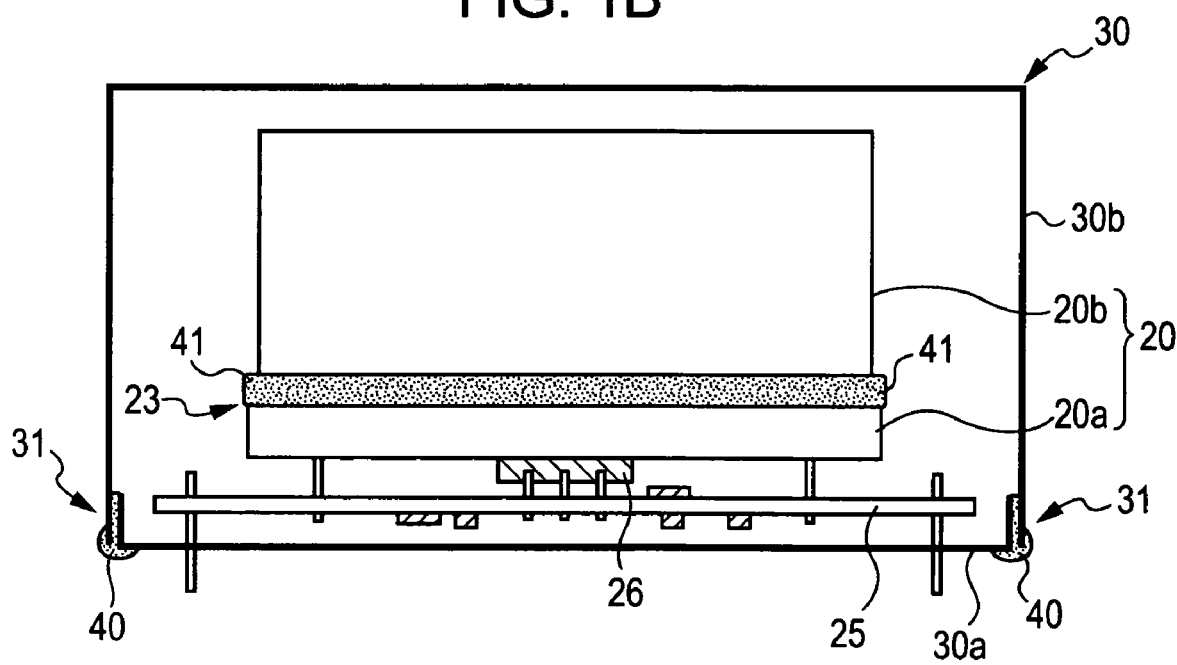

FIG. 1A is a longitudinal cross-sectional view illustrating a structure of a high-stability piezoelectric oscillator according to a first embodiment of the invention and FIG. 1B is a longitudinal cross-sectional view of an outer metallic case in the high-stability piezoelectric oscillator.

The high-stability piezoelectric oscillator using a double thermostatic oven includes an oscillating circuit unit 14 that has a piezoelectric vibrator 12 and oscillating circuit components 13, an inner oven 15 (having an inner lower case member 15a and an inner upper case member 15b) that accommodates the oscillating circuit unit 14, an outer oven 20 (having an outer lower case member 20a and an outer upper case member 20b) that accommodates the inner oven 15, a base printed circuit board 25 that supports the oscillating circuit unit 14, the inner oven 15, and the outer oven 20, and an outer metallic case 30 (having a lower metallic case member 30a and an upper metallic case member 30b) that covers the outer oven 20 and the base printed circuit board 25. The inner printed circuit board 16 is disposed in the inner oven 15 such that it supports the piezoelectric vibrator 12 and the oscillating circuit components 13. In addition, the outer printed circuit board 21 is disposed in the outer oven 20 such that it supports the inner oven 15, a heater 22, and temperature control circuit components of the heater 22. The base printed circuit board 25 supports the outer oven 20, a heater 26, and temperature control circuit components of the heater 26. The inner printed circuit board 16 and the outer printed circuit board 21 are electromechanically connected to each other by means of connection pins P1, and the outer printed circuit board 21 and the base printed circuit board 25 are electromechanically connected to each other by means of connection pins P2. Further, a pin P3 whose upper end portion is fixed on a base printed circuit board 25 passes through a hole formed in the lower metallic case member 30a via an insulating member so as to protrude toward the outside of the lower metallic case member 30a, and a lower end portion of the connection pin P3 is inserted into a through hole formed in a mother printed circuit board (not shown) and then connected to the mother board by means of soldering bonding. In this manner, the high-stability piezoelectric oscillator is mounted on the mother printed circuit board.

All of peripheral portions of each of bonding portions 31 between the lower metallic case member 30a and the upper metallic case member 30b, which form the outer metallic case 30, are airtightly sealed with a resin (for example, an epoxy resin) or a sealant 40, such as solder or the like. In the present embodiment, the lower metallic case member 30a is thrust into a skirt portion of the upper metallic case member 30b, so that the bonding portion 31 is formed. Therefore, when the sealant 40 is coated, the sealant 40 having fluidity is filled in a gap of the bonding portion 31 in a state in which the entire oscillator is reversed. In addition, the sealant 40 is coated such that it adheres over a predetermined range of an outer surface of the bonding portion 31 in a vertical direction.

A characteristic structure of the present embodiment is as follows. In addition to obtaining the airtightness inside or outside the outer metallic case by airtightly sealing the bonding portion 31 of the outer metallic case 30 with the sealant 40, all of peripheral portions of the bonding portion 23 between the outer lower case member 20a and the outer upper case member 20b, which form the outer oven 20, are airtightly sealed with a resin (for example, an epoxy resin) or the sealant 41, such as solder or the like. The sealant 41 is coated in a step before installing the outer metallic case 30, in particular, the upper metallic case 30b such that the sealant 41 is filled in the gap of the bonding portion 23 by a predetermined amount and attached to the outer surface of the bonding portion 23 over a predetermined range in a vertical direction.

In the present embodiment, all of peripheral portions of the bonding portion 23 between the outer lower case member 20a and the outer upper case member 20b, which form the outer oven 20, are airtightly sealed with the sealant 41. Therefore, variation in assembling between the upper and lower case members 20a and 20b can be prevented, and heat conductivity of the outer oven 20 can be made to be uniform. That is, variation in assembling between the upper and lower case members 20a and 20b can cause variation in an interval, a width, or the like of the gap of the bonding portion 23, which causes variation in heat conductivity of the outer oven 20 in an individual oscillator. However, since the sealant is filled into the gap, even though the variation between the case members exists, the heat conductivity of the entire outer oven can be made to be uniform. Thereby, it is possible to markedly improve the frequency-temperature characteristic.

In the high-stability piezoelectric oscillator using the double thermostatic oven, since the bonding portion 31 of the outer metallic case is airtightly sealed, even though the air between the outer metallic case 30 and the outer oven 20 is expanded or contracted in response to the variation of the outside air, the outer oven 20 opens and the inner temperature is maintained at a predetermined temperature. Therefore, since the high-stability piezoelectric oscillator is barely affected by the expansion or the contraction, it is possible to achieve frequency stability of about $10^{-10}$ order.

FIGS. 2A and 2B are graphs illustrating a frequency-temperature characteristic before all of peripheral portions of the bonding portion 23 of the outer oven 20 in the high-stability piezoelectric oscillator (crystal oscillator) shown in FIGS. 1A and 1B are sealed with an epoxy resin serving as a sealant 41, and graphs obtained by plotting variations of a frequency and an ambient temperature with respect to the number of measurements (time) at each time. For the temperature profile, it is set that the ambient temperature becomes 25° C.→−30° C.→25° C.→70° C.→25° C., and the variation of a frequency at this time is confirmed. In FIG. 2A, the frequency stability of $10^{-10}$ order can be achieved with respect to the variation of the ambient temperature within a range of −30 to 70° C., but in FIG. 2B, the frequency variation width with respect to the same temperature variation increases, so that the frequency stability of $10^{-9}$ order is achieved.

Figure 3A:
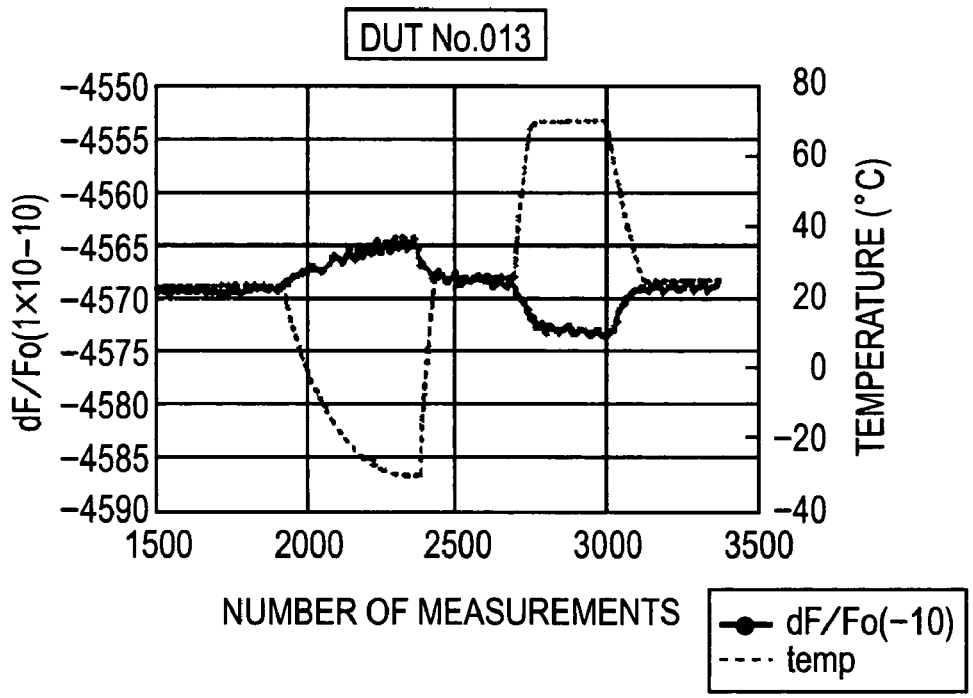
FIGS. 3A and 3B are graphs illustrating a frequency-temperature characteristic after all of peripheral portions of a bonding portion of an outer oven are sealed with an epoxy resin.
Figure 3B:
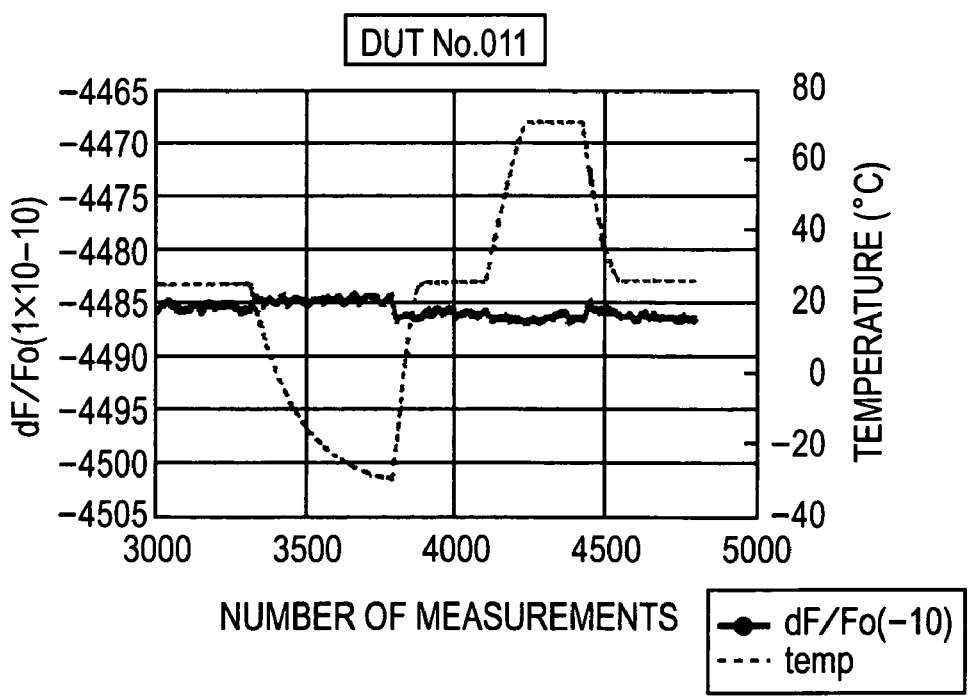

Next, FIGS. 3A and 3B are graphs illustrating a frequency-temperature characteristic after all of peripheral portions of the bonding portion 23 of the outer oven 20 are sealed with an epoxy resin 41, and graphs obtained by performing the same measurement with respect to the same sample illustrating the results of FIGS. 2A and 2B. According to the result of FIG. 3A (DUT No. 013), the substantially same characteristic is obtained before and after sealing the epoxy resin, but according to the result of FIG. 3B (DUT No. 011), the frequency-temperature characteristic is markedly improved after sealing the epoxy resin.

As described above, the frequency-temperature characteristic of the high-stability piezoelectric oscillator (high stability crystal oscillator) can be improved by the sealing structure according to the present embodiment, and the high-stability piezoelectric oscillator according to the present embodiment is very effective in improving a manufacture yield.

In addition, a resin or solder may be used as a sealant.

Figure 4:
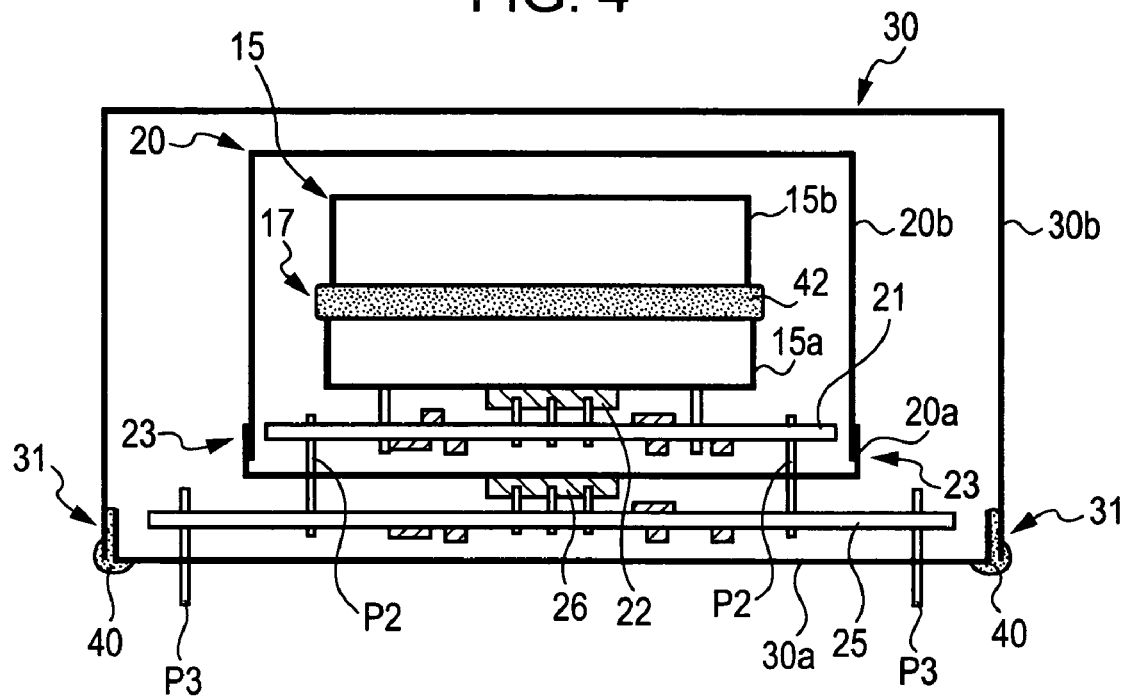
FIG. 4 is a longitudinal cross-sectional view of an outer metallic case and an outer oven of a high-stability piezoelectric oscillator (high-stability crystal oscillator) according to a second embodiment of the invention.

Next, FIG. 4 is a longitudinal cross-sectional view of an outer metallic case and an outer oven of a high-stability piezoelectric oscillator (high stability crystal oscillator) according to a second embodiment of the invention. In FIG. 4, the same portions as those shown in FIG. 1B are denoted by the same reference numerals, and the overlapping description will be omitted. The inner structure of the inner oven shown in FIG. 4 is substantially the same as that shown in FIG. 1A.

A characteristic structure of the high-stability piezoelectric oscillator using the double thermostatic oven according to the present embodiment is as follows. In addition to obtaining the airtightness inside and outside the outer metallic case by airtightly sealing the bonding portion 31 of the outer metallic case 30 by means of the sealant 40, all of peripheral portions of the bonding portion 17 between the inner lower case member 15a and the inner upper case member 15b, which form the inner oven 15, are airtightly sealed with a resin (for example, an epoxy resin) or the sealant 42, such as solder or the like. The sealant 42 is coated in a step before installing the outer oven 20, particularly, the outer upper case member 20b such that the sealant 42 is filled in the gap of the bonding portion 17 by a predetermined amount and attached to the outer surface of the bonding portion 17 over a predetermined range in a vertical direction. In addition, an epoxy resin, solder, or the like may be used as a sealant 42.

In the present embodiment, all of peripheral portions of the bonding portion 17 between the inner lower case member 15a and the inner upper case member 15b, which form the inner oven 15, are airtightly sealed with the sealant 42. Therefore, variation in assembling between the upper and lower case members 15a and 15b can be prevented, and heat conductivity of the inner oven 15 can be made to be uniform. That is, variation in assembling between the upper and lower case members 15a and 15b causes the variation in an interval, a width, or the like of the gap of the bonding portion 17, which causes the variation in heat conductivity of the inner oven 15 in an individual oscillator. However, since the sealant is filled into the gap, even if the variation exists between the case members, the heat conductivity of the entire outer oven can be made to be uniform. Thereby, it is possible to markedly improve the frequency-temperature characteristic.

In the high-stability piezoelectric oscillator using the double thermostatic oven, it is possible to achieve frequency stability of $10^{-10}$ order without being affected by the temperature variation of the outside air while airtightly sealing the bonding portion 31 of the outer metallic case.

With respect to the frequency-temperature characteristic before and after all of peripheral portions of the bonding portion 17 of the inner oven 15 in the high-stability piezoelectric oscillator according to the second embodiment are sealed with the sealant 42, the experimental data according to the first embodiment illustrated in FIGS. 2 and 3 can be applied.

In addition, in the first and second embodiments, the bonding portion of the outer oven or the bonding portion of the inner oven are sealed with the sealant, but the bonding portions of both the outer oven and the inner oven may be sealed.

In the above-mentioned embodiments, since the high stability of the frequency is achieved by increasing the heat capacity of the thermostatic oven, high stability with respect to the variation of the temperature may be obtained. However, the frequency-rising edge characteristic may be deteriorated.

Accordingly, in a high-stability piezoelectric oscillator having a double thermostatic oven according to a third embodiment of the invention, a new structure for improving the frequency-rising edge characteristic is adopted. In addition, in the high-stability piezoelectric oscillator according to the third embodiment, the frequency-rising edge characteristic can be improved without depending on whether the sealants 40, 41, and 42 for airtightly sealing the respective bonding portions 31, 23, and 17 exist, but for convenience of description, the third embodiment will be described with reference to FIGS. 1A and 1B which illustrate the first embodiment.

A characteristic structure of the high-stability piezoelectric oscillator using the double thermostatic oven according to the present embodiment is as follows. In the high-stability piezoelectric oscillator with the double thermostatic oven, the double thermostatic oven includes an inner oven 15 that accommodates the piezoelectric vibrator 12 therein and an outer oven 20 that accommodates the inner oven 15 therein, different materials having different heat conductivity are used as a metallic material forming the inner oven 15 and the metallic material forming the outer oven 20, and in this case, the heat conductivity of the metallic material forming the inner oven 15 is smaller than that of the metallic material forming the outer oven 20. Specifically, for example, the inner oven 15 is made of aluminum and the outer oven 20 is made of copper.

Alternatively, the heat capacity of the outer oven 15 may be decreased while the ovens 15 and 20 are formed with the same metallic material, so that the same effect may be achieved. Specifically, the outer oven is formed of a thin metallic material and the inner oven is formed of a thick metallic material, such that they are formed in a block shape, thereby making the heat capacity of the inner oven 15 different from the heat capacity of the outer oven 20.

Figure 5:
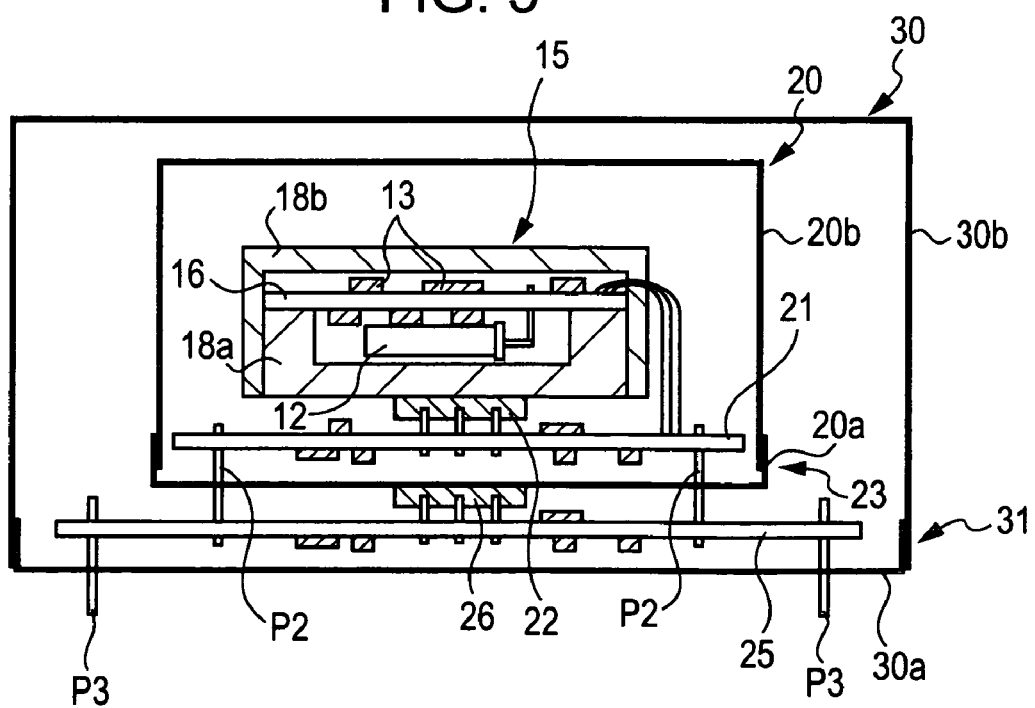
FIG. 5 is a longitudinal cross-sectional view illustrating a structure of a high-stability piezoelectric oscillator using a double thermostatic oven according to a fourth embodiment of the invention.

Next, FIG. 5 is a longitudinal cross-sectional view illustrating a structure of a high-stability piezoelectric oscillator using a double thermostatic oven according to a fourth embodiment of the invention. Similar to the third embodiment, according to the fourth embodiment, the frequency-rising edge characteristic can be improved. The fourth embodiment will be described with reference to FIG. 1A, and the same constituent elements as FIG. 1A will be denoted by the same reference numerals. In addition, in FIG. 5, the sealant is not filled into the bonding portion of each oven and the bonding portion of the outer metallic case, but the sealant may be filled.

In the present embodiment, a metallic block having large heat capacity is used as the inner oven 15, and a thin metallic case having small heat capacity is used as an outer oven 20. Specifically, for example, a heating cylinder with a block shape using a thick aluminum material is used as the inner oven 15, and a heating cylinder with a case shape using a thin copper plate is used as the outer oven 20.

The inner oven 15 according to the present embodiment has a lower block 18a that has a top surface where a concave portion is formed, and an upper block 18b that closes the concave portion by covering the lower block 18a. The inner printed circuit board 16 is supported by the top surface of the lower block 18a, and the piezoelectric vibrator 12 supported by the bottom surface of the inner printed circuit board 16 and the circuit components are sealed with the upper block 18b in a state in which they are disposed in the concave portion.

The bonding portion 31 of the outer metallic case 30 may be sealed or not sealed by the sealant. In addition, it is true for the bonding portion 23 of the outer oven 20.

According to the present embodiment, it is possible to achieve at least the same temperature stability (0.1° C. or less) as the oscillator which has a structure using the thermos bottle or the metallic block as the heating cylinder, and it is possible to obtain the oscillation output with extremely high stability with respect to the variation of the temperature.

In addition, since a metallic material having heat conductivity is used as the outer oven 20 and the case structure with the relatively small heat capacity is used in the present embodiment, it is possible to stabilize the temperature in the outer oven for a short time. Accordingly, even though a structure having a relatively large heat capacity like the aluminum block is used as the inner oven 15, it is possible to stabilize the temperature of the inner oven accommodated in the outer oven and the temperature of the oscillating circuit unit accommodated in the inner oven for a short time.

From the above-mentioned description, it is apprehended that a fast frequency rising edge characteristic may be achieved without deteriorating the frequency stability.

Figure 6:
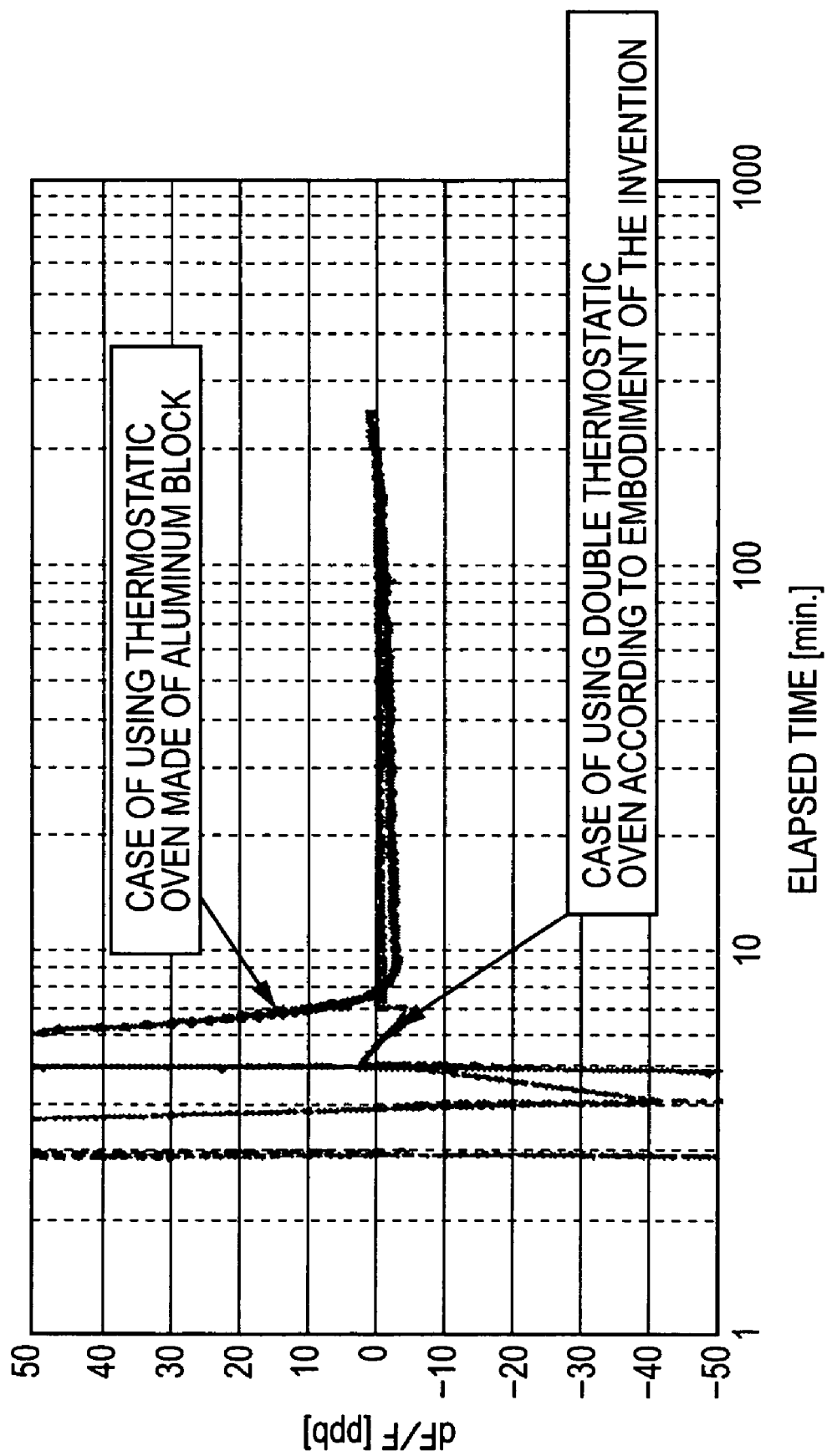
FIG. 6 is a graph illustrating a comparative result between frequency-rising edge characteristics of a high-stability piezoelectric oscillator according to the embodiment illustrated in FIG. 5 and an oscillator using a thermostatic oven made of an aluminum block.
Figure 7:
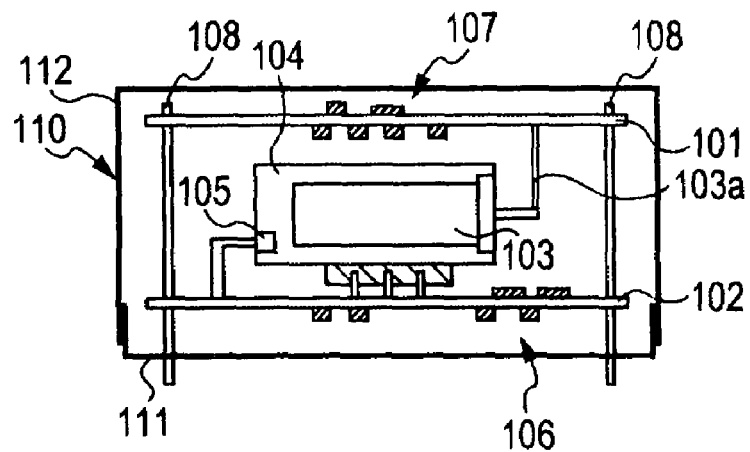
FIG. 7 is a diagram illustrating a structure of a first example according to the related art.
Figure 8:
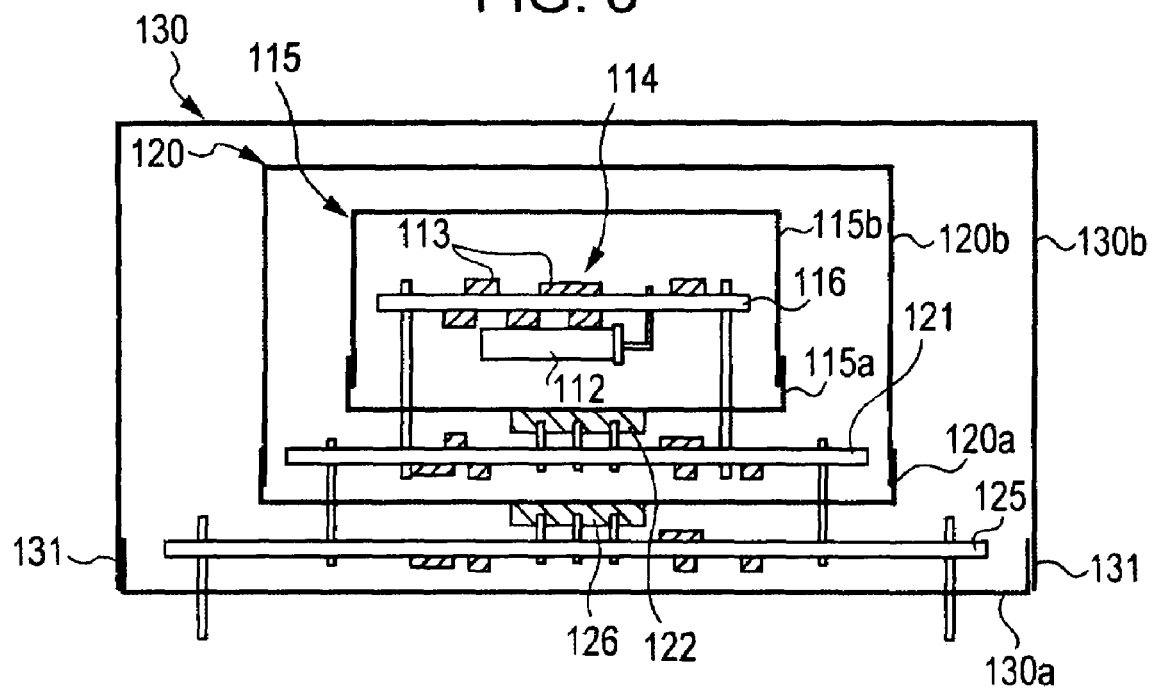
FIG. 8 is a diagram illustrating a structure of a second example according to the related art.

Next, FIG. 6 is a diagram illustrating a comparative result of frequency-rising edge characteristics between a high-stability piezoelectric oscillator according to a fifth embodiment and the oscillator using the thermostatic oven made of the aluminum block, and illustrates the result obtained by setting an elapsed time after supplying a power to a horizontal axis and plotting the frequency variation with respect to the elapsed time at each time. As apprehended from FIG. 6, the high-stability piezoelectric oscillator using the double thermostatic oven according to the embodiment of the invention has a superior frequency-rising edge characteristic.

In the high-stability piezoelectric oscillator using the double thermostatic oven, when the bonding portion of the outer metallic case is sealed, since the air having permeated into the case causes the expansion or contraction due to the temperature variation of the outside air, even when the outer metallic case is airtightly sealed so as to prevent the outside air from permeating in the outer metallic case, it is not possible to achieve the ideal frequency stability of $10^{-10}$ order.

In contrast, in the high-stability piezoelectric oscillator using the double thermostatic oven according to the embodiment of the invention, at least one of a bonding portion between an outer lower case member and an outer upper case member, which form the outer oven, and a bonding portion between an inner lower case member and an inner upper case member, which form the outer oven, is sealed with the sealant. Therefore, it is possible to achieve frequency stability of $10^{-10}$ order without being affected by the temperature variation of the outside air while airtightly sealing the bonding portion of the outer metallic case.

Next, when the double thermostatic oven is used, since the high stability of the frequency is achieved by increasing the heat capacity of the thermostatic oven, it is possible to obtain the high stability with respect to the temperature, but the frequency-rising edge characteristic may be deteriorated. In contrast, according to the embodiment of the invention, since a material having higher heat conductivity than a metallic material for forming the inner oven is used as a metallic material for forming the outer oven, it is possible to improve the frequency-rising edge characteristic.

Further, the outer oven is made of a thin metallic material so as to decrease a heat capacity, and the inner oven is made of a thick metallic material in a block shape so as to increase a heat capacity. Therefore, it is possible to improve the frequency-rising edge characteristic.

What is claimed is:

1. A high-stability piezoelectric oscillator comprising:
an oscillating circuit unit that has a piezoelectric vibrator and oscillating circuit components;
an inner oven that accommodates the oscillating circuit unit;
an outer oven that accommodates the inner oven; and
an outer metallic case that is separate from and accommodates the outer oven, airtightness being ensured inside and outside the outer metallic case,
wherein at least one of the outer oven and the inner oven is airtightly sealed; and
wherein a material having higher heat conductivity than a metallic material for forming the inner oven is used as a metallic material for forming the outer oven.

2. high-stability piezoelectric oscillator according to claim 1,
wherein at least one of a bonding portion between an outer lower case member and an outer upper case member, which form the outer oven, and a bonding portion between an inner lower case member and an inner upper case member, which form the inner oven, is airtightly sealed by using an epoxy resin or solder as a sealant.

3. A high-stability piezoelectric oscillator comprising:
an oscillating circuit unit that has a piezoelectric vibrator and oscillating circuit components;
an inner oven that accommodates the oscillating circuit unit;
an outer oven that accommodates the inner oven; and
an outer metallic case that is separate from and accommodates the outer oven, wherein the outer oven is made of a thin metallic material so as to decrease a heat capacity, and
the inner oven is made of a thick metallic material in a block shape so as to increase a heat capacity; and
wherein a material having higher heat conductivity than a metallic material for forming the inner oven is used as a metallic material for forming the outer oven.

* * * * *